(12) United States Patent
Conte et al.

(10) Patent No.: US 10,658,048 B2
(45) Date of Patent: May 19, 2020

(54) FLOATING BOOSTED PRE-CHARGE SCHEME FOR SENSE AMPLIFIERS

(71) Applicant: STMicroelectronics S.r.l., Agrate Brianza (MB) (IT)

(72) Inventors: Antonino Conte, Tremestieri Etneo (IT); Loredana Chiaramonte, Catania (IT); Anna Rita Maria Lipani, Termini Imerese (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 16/104,001

(22) Filed: Aug. 16, 2018

(65) Prior Publication Data

US 2020/0058360 A1    Feb. 20, 2020

(51) Int. Cl.
*G11C 16/28* (2006.01)
*G11C 16/24* (2006.01)
*G11C 16/04* (2006.01)

(52) U.S. Cl.
CPC .......... *G11C 16/28* (2013.01); *G11C 16/0408* (2013.01); *G11C 16/24* (2013.01)

(58) Field of Classification Search
CPC ...... G11C 16/28; G11C 16/24; G11C 16/0408
See application file for complete search history.

(56) References Cited

U.S. PATENT DOCUMENTS

| | | | |
|---|---|---|---|
| 6,134,157 A | 10/2000 | Takeuchi | |
| 6,323,724 B1 * | 11/2001 | Uekubo | G05F 3/205 327/538 |
| 6,856,547 B2 | 2/2005 | Poidomani et al. | |
| 6,859,397 B2 | 2/2005 | Lutze et al. | |
| 6,954,102 B2 | 10/2005 | Bedarida et al. | |
| 7,236,409 B2 | 6/2007 | Isobe | |
| 7,477,559 B2 | 1/2009 | Taddeo | |
| 9,384,850 B2 | 7/2016 | Barsilai | |
| 9,679,618 B2 | 6/2017 | Conte et al. | |
| 2004/0252568 A1* | 12/2004 | La Rosa | G11C 7/067 365/207 |
| 2011/0090745 A1* | 4/2011 | La Rosa | G11C 7/12 365/189.09 |
| 2013/0279255 A1* | 10/2013 | Kamata | G11C 16/26 365/185.11 |
| 2015/0332739 A1* | 11/2015 | Conte | G11C 7/062 365/189.07 |

* cited by examiner

*Primary Examiner* — Khamdan N. Alrobaie
(74) *Attorney, Agent, or Firm* — Slater Matsil, LLP

(57) ABSTRACT

A sense structure includes: a sense amplifier core configured to compare a measurement current with a reference current; a cascode transistor coupled to the sense amplifier core and configured to be coupled to a load; a switch coupled between a bias voltage node and a control terminal of the cascode transistor; a local capacitor having a first terminal coupled to the control terminal of the cascode transistor; a first transistor coupled between a second terminal of the local capacitor and a reference terminal; and a control circuit coupled to a control terminal of the first transistor, the control circuit configured to disconnect the local capacitor from the reference terminal to produce a voltage overshoot in the control terminal of the cascode transistor, and after disconnecting the local capacitor from the reference terminal, limit or reduce the voltage overshoot by adjusting a voltage of the control terminal of the first transistor.

20 Claims, 5 Drawing Sheets

US 10,658,048 B2

FLOATING BOOSTED PRE-CHARGE SCHEME FOR SENSE AMPLIFIERS

TECHNICAL FIELD

The present invention relates generally to an electronic system and method, and, in particular embodiments, to a floating boosted pre-charge scheme for sense amplifiers.

BACKGROUND

In memory devices, such as non-volatile memory (NVM) devices, sense amplifiers are commonly used to determine (read) the state of a memory cell (e.g., 0 or 1) by measuring a current associated with the cell. Typically, a sense amplifier compares the current associated with the memory cell with a reference current. Such currents may be in the order of a few pA. Typically, a memory device simultaneously reads (in parallel) a word formed by the logic values stored in a selected page of memory cells (for example, containing 64-256 memory cells) by using a plurality of sense amplifiers. Typically, the memory device includes a sense amplifier per memory cell to be read simultaneously (e.g., a word or page).

During a read operation, a sense amplifier typically keeps its terminals receiving the measuring current and the reference current at a predetermined read voltage. For example, in non-volatile memory devices that include memory cells implemented with its floating-gate metal-oxide semiconductor (MOS) transistors, the read voltage is used to bias the selected memory cells for reading so that their MOS transistors are conductive or non-conductive according to the stored logic value.

An accurate control of the sensing voltage is desirable in many applications of the sense amplifiers. For example, in non-volatile memory devices, the sensing voltage should be maintained at a value such as to enable the correct discrimination of the logic values stored in the selected memory cells, but without altering the state of the memory cells (i.e., without overwriting the memory cells). This may be particularly important when the sensing voltage has relatively low value (for example, <1-2V).

For this purpose, the sense amplifiers are usually equipped with a voltage regulator for regulating the sensing voltage to limit possible variations with respect to its desired value. A typical implementation of such voltage regulator is with transistors (for example, of the MOS type) in cascode configuration. Since a cascode driver is a low impedance driver, this structure allows pre-loading of the terminals of the sense amplifiers to the sensing voltage during a pre-charge phase in a relatively fast way. A cascode structure also allows for efficient separation of the bit-line from the core of the sense amplifier, which allows for proper operation even when the sense amplifier is coupled to a load with high capacitance, such as a column of memory cells in the non-volatile memory devices. Particularly, in a cascode configuration with fixed control (for example, of the gate type), the sensing voltage is regulated by controlling the transistors of the voltage regulator by a biasing voltage of constant value (provided by a biasing stage being common to all the sense amplifiers).

SUMMARY

In accordance with an embodiment, a sense structure includes: a sense amplifier core configured to compare a measurement current with a reference current; a cascode transistor coupled to the sense amplifier core and configured to be coupled to a load; a switch coupled between a bias voltage node and a control terminal of the cascode transistor; a local capacitor having a first terminal coupled to the control terminal of the cascode transistor; a first transistor coupled between a second terminal of the local capacitor and a reference terminal; and a control circuit coupled to a control terminal of the first transistor, the control circuit configured to disconnect the local capacitor from the reference terminal to produce a voltage overshoot in the control terminal of the cascode transistor, and after disconnecting the local capacitor from the reference terminal, limit or reduce the voltage overshoot by adjusting a voltage of the control terminal of the first transistor.

In accordance with an embodiment, a non-volatile memory includes: a plurality of memory cells arranged in rows a columns; a row decoder coupled to the plurality of memory cells via a plurality of word lines; a column decoder coupled to the plurality of memory cells via a plurality of bit lines; a biasing stage configured to generate a biasing voltage; and a plurality of sense amplifiers, where each sense amplifier includes: a sense amplifier core configured to compare a measurement current with a reference current; a cascode transistor coupled between the sense amplifier core and a bit line of the plurality of bit lines; a switch coupled between an output of the biasing stage and a control terminal of the cascode transistor; a local capacitor having a first terminal coupled to the control terminal of the cascode transistor; a first transistor coupled between a second terminal of the local capacitor and a reference terminal; and a control circuit coupled to a control terminal of the first transistor, the control circuit configured to disconnect the local capacitor from the reference terminal to produce a voltage overshoot in the control terminal of the cascode transistor; and after disconnecting the local capacitor from the reference terminal, limit or reduce the voltage overshoot by adjusting a voltage of the control terminal of the first transistor.

In accordance with an embodiment, a method of reading a non-volatile memory includes: generating a biasing voltage at a biasing terminal; during a pre-charge phase, disconnecting a control terminal of a cascode transistor from the biasing terminal, the cascode transistor coupled between a sense amplifier core and a bit line of the non-volatile memory; disconnecting from a reference terminal a local capacitor that is coupled to the control terminal of the cascode transistor; and after disconnecting the local capacitor from the reference terminal, limiting or reducing a voltage overshoot at the control terminal of the cascode transistor by adjusting a voltage of a control terminal of a first transistor coupled between the local capacitor and the reference terminal.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
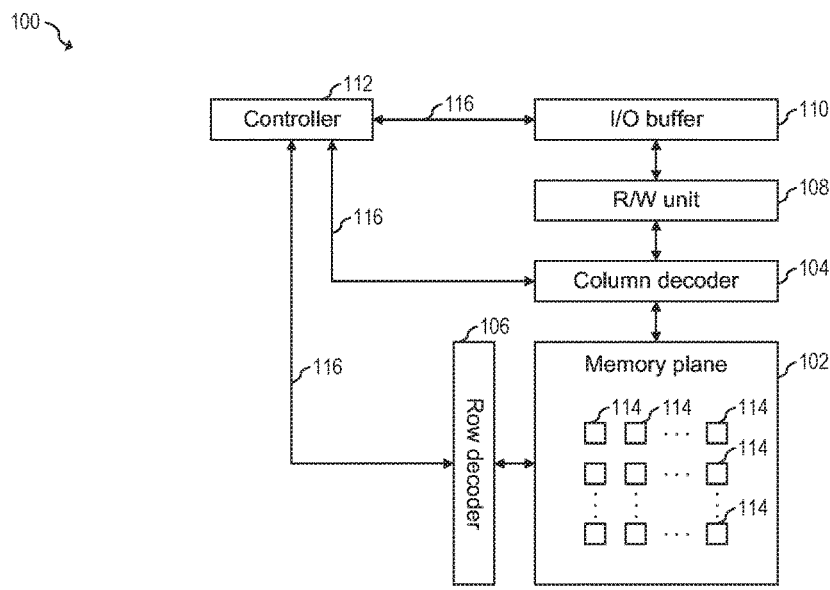
FIG. 1 shows an NVM, according to an embodiment of the present invention.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

The present invention will be described with respect to embodiments in a specific context, an NVM device having one or more sense amplifiers. Embodiments of the present invention may be used in other types of memories. Some embodiments may be used in devices other than memory devices that would benefit from the use of sense amplifiers.

Embedded non-volatile memory (eNVM) technologies are scaling down. Reduced cell size is typically associated with a reduction of the reference current used to sense the status of the NVM cell (e.g., 0 or 1). Reduced cell size is also associated with low gain. Low measurement currents and low cell gain make it hard to discriminate the status of the NVM cell (e.g., 0 or 1). Increasing the accuracy of the reference current helps a sense amplifier determine the status of the NVM cell (e.g., 0 or 1).

Reduced cell size is also associated increased cell degradation, for example, as a result of cell cycling (i.e., programing and erasure of the cell). For example, the voltage at the control terminals of the memory device transistors should be limited to predetermined levels to avoid transistor damage or degradation.

At the same time, there is increasing demand for low reading current consumption and high reading speed (low access time).

The reading speed may be increased by using a closed loop scheme to control the cascode transistor, where the feedback loop includes an inverter that is operated in the linear region. Operating the inverter in the linear region causes the inverter to dissipate current (e.g., from Vdd, through the high-side transistor, through the low-side transistor, to ground) that is not used to pre-charge the bit lines.

The current consumption may be reduced by operating the cascode transistor in open loop, such as described in U.S. Pat. No. 9,679,618, which is hereby incorporated by reference herein in its entirety. However, known closed loop systems tend to be faster than known open loop systems because of the closed-loop system's ability to cause a controlled overshoot at the gate of the cascode transistor coupled to the bit line to be pre-charged.

In an embodiment of the present invention, an NVM increases the reading speed by reducing the pre-charge phase time while keeping the power consumption low. The pre-charge phase time is reduced by causing an overshoot in the gate of the cascode transistor, which increases the charging speed of the bit lines to be pre-charged. In some embodiments, the overshoot is controlled in a closed loop but without using an inverter operated in the linear region.

FIG. 1 shows NVM 100, according to an embodiment of the present invention. NVM 100 may be embedded in, for example, a microcontroller or processor, a security apparatus or other secure element, an application-specific integrated circuit (ASIC), radio-frequency identification (RFID) circuits, a memory device, or any other device or apparatus having integrated memory.

NVM 100 includes memory plane 102, column decoder 104, row decoder 106, read/write (R/W) unit 108, input/output (I/O) buffer 110, and controller 112. Memory plane 102 includes a plurality of memory cells 114 arranged in rows and columns. Memory cells 114 of each row are coupled to the same word line (not shown). Memory cells 114 of each column are coupled to the same bit line (not shown). Each memory cell 114 may have a different state, such as a state represented by a logic value (i.e., 0 or 1).

During normal operation, controller 112 sends an address and instruction (e.g., read or write) to row decoder 106 and column decoder 104. Row decoder 106 and column decoder 104 bias the word lines and bit lines to select the memory cells 114 associated with the address.

For a write operation, the data to be written is received by I/O buffer, transferred to the R/W unit 108. Column decoder 104 configures memory plane 102 to program the selected memory cells 114 with logic values reflecting the data receiver from I/O buffer 110 with altering the values of non-selected memory cells 114.

For a read operation, column decoder 104 configures memory plane to read the logic values of the selected memory cells 114 using sense amplifiers (not shown) in R/W unit 108. The read data is then transferred to I/O buffer 110.

Memory cells 114 may be, for example, floating-gate MOS transistors. Other memory cell types may be used. For example, memory cells 114 may be of the phase-change memory (PCM) type, resistive random-access memory (RRAM) type, or magnetoresistive random-access memory (MRAM) type. One-time programmable (OTP) cells may also be used.

R/W unit 108 includes circuits for reading and writing memory cells 114. For example, R/W unit 108 includes a sense structure (not shown) that includes one or more sense amplifiers configured to determine the content of memory cells 114. The sense structure is configured to read one or more bits at a time (e.g., a word, such as an 8 bit, 16 bit, or 32 bit word).

Row decoder 106, column decoder 104, and I/O buffer 110 may be implemented in any way known in the art. For example, in some embodiments, row decoder 106, column decoder 104, and I/O buffer 110 may be implemented using digital technology in a known way.

Controller 112 is configured to control NVM 100 using a plurality of control signals 116 to perform, for example, a read operation or a write operation. Controller 112 may be implemented in any way known in the art. For example, controller 112 may be implemented using state machines or other digital circuits.

A read operation typically involved a pre-charge phase and a read (sense) phase. Details of the structure and method associated with performing a read operation on NVM 100 are described with reference to FIGS. 2-7.

Figure 2:
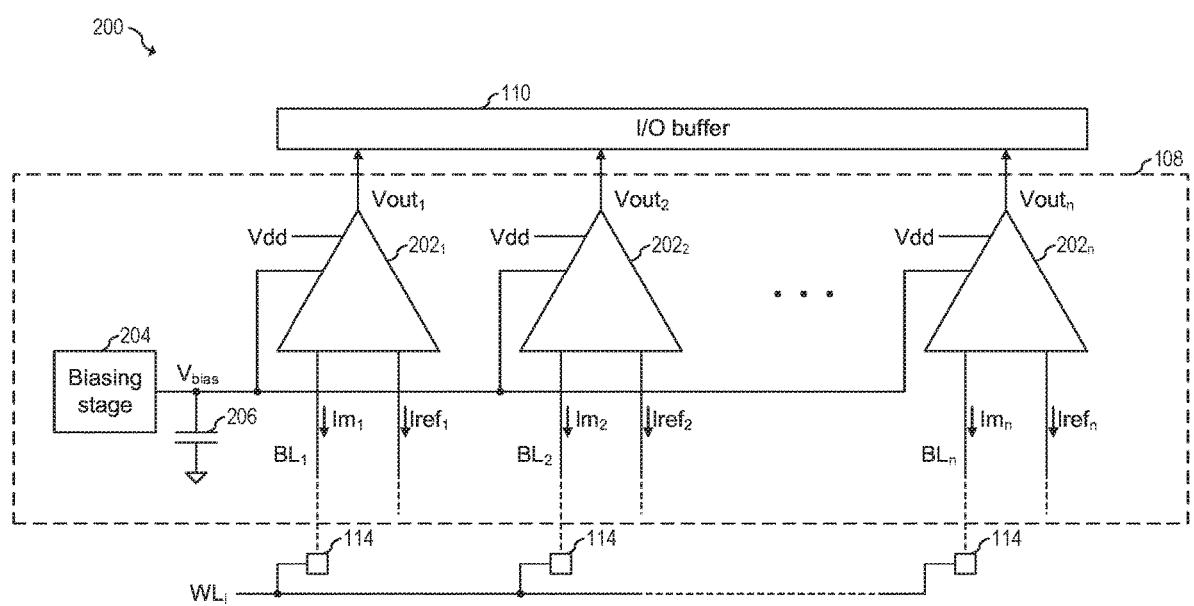
FIG. 2 shows a sense structure of the NVM of FIG. 1, according to an embodiment of the present invention.

FIG. 2 shows sense structure 200, according to an embodiment of the present invention. Sense structure 200 is inside R/W unit 108, and includes n sense amplifiers 202, biasing stage 204, and regulating capacitor 206. In some embodiments, sense structure 200 includes 8 sense amplifiers 202 (i.e., n=8). A different number of sense amplifiers, such as 16, 32, 38, 64, etc., may be used.

During a read operation, a group of memory cells 114 to be read are selected with word line $WL_i$. Bit lines BL associated with the selected memory cells 114 are biased to a read voltage during a pre-charge phase. In some embodiments, the read voltage is between 1 V and 2 V. Other read voltages may be used.

After the pre-charge phase, and after the voltages of the bit lines BL associated with the selected memory cells 114 have settled to the read voltage, sense amplifiers 202 compare respective currents Im with respective reference currents Iref to determine the state of the selected memory cells 114. Respective sense amplifiers 202 generate respective outputs Vout based on the state of the respective selected memory cells 114. For example, in some embodiments, a memory cell 114 exhibits little or no measurement current Im ($Im_{low}$) when biased with a read voltage and storing a first logic value (e.g., 0 or 1) and exhibits a higher measurement current Im ($Im_{high}$) when biased with the read voltage and storing a second logic value (e.g., 1 or 0). By comparing measurement current Im with reference current Iref, sense amplifier 202 determines the logic value stored in the selected memory cell 114. In some embodiments, reference current Iref is typically about $$\frac{Im_{low} + Im_{high}}{2}.$$

Biasing stage 204 is configured to generate voltage $V_{bias}$ and to provide voltage $V_{bias}$ to all sense amplifiers 202. In some embodiments, biasing stage 204 generates voltage $V_{bias}$ to a voltage higher than a supply voltage Vdd. Biasing stage 204 may generate the boosted voltage by using, for example, a charge pump (not shown). Other embodiments may generate voltage $V_{bias}$ at a voltage equal to or lower than supply voltage Vdd.

As shown in FIG. 2, regulating capacitor 206 is common to all sense amplifiers 202. Capacitor 206 is configured to regulate voltage $V_{bias}$ and filter noise. The noise affecting voltage $V_{bias}$ may be caused, for example, by one or more of measuring currents Im.

The pre-charge phase typically takes a significant amount of time of the total access time. Reducing the time to pre-charge the bit lines BL associated with the selected memory cells 114, therefore, advantageously increases the reading speed of memory cells 114.

In an embodiment, the pre-charge time is reduced by causing a controlled overshoot in the gate of the cascode transistor. The overshoot is controlled by using a sense control circuit that adjusts the voltage of a gate of a first transistor that is coupled between a local capacitor and ground, where the local capacitor is connected to the gate of the cascode transistor. In some embodiments, the sense control circuit controls the voltage of the first transistor based on the different between the voltage at the gate of the cascode transistor and a biasing voltage.

Figure 3:
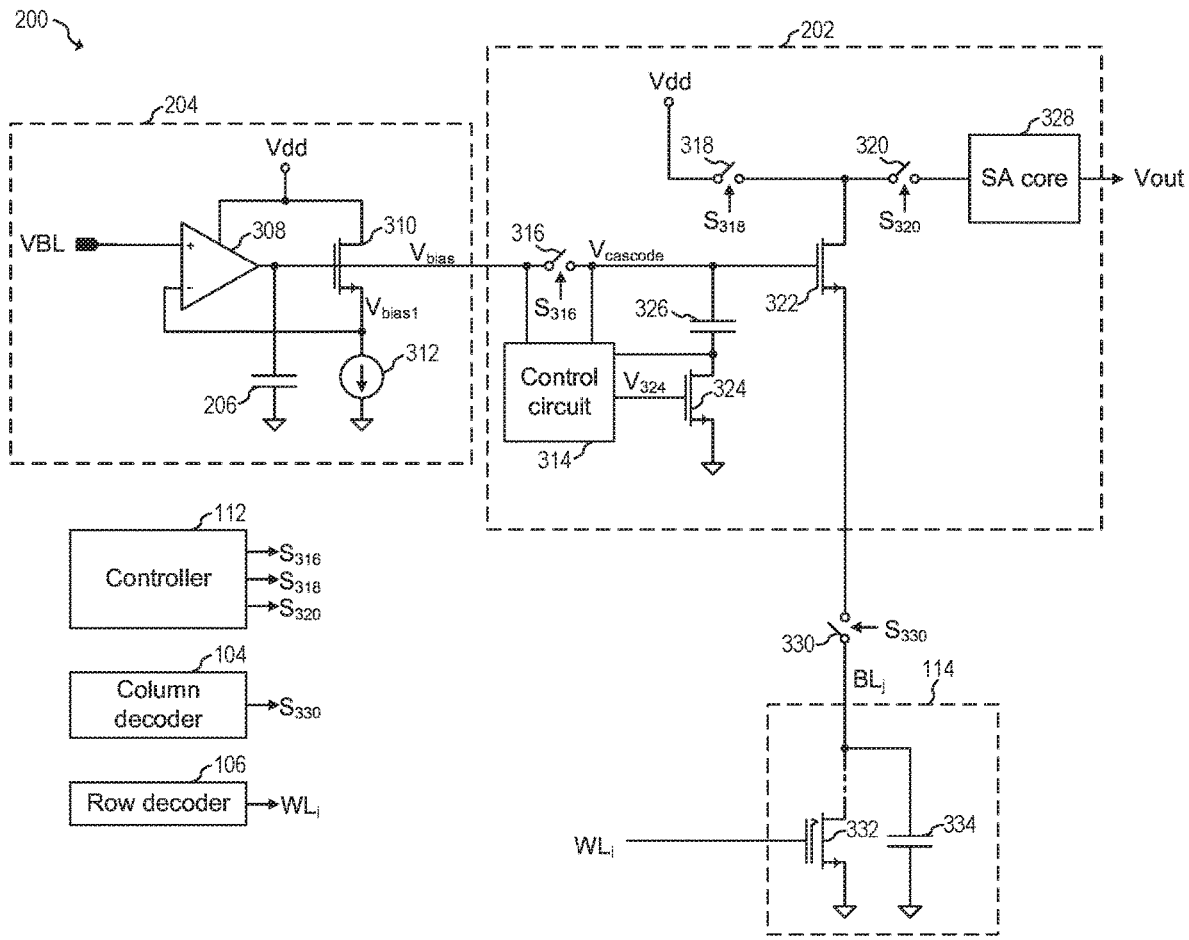
FIG. 3 shows details of the sense structure of FIG. 2, according to an embodiment of the present invention.
Figure 4:
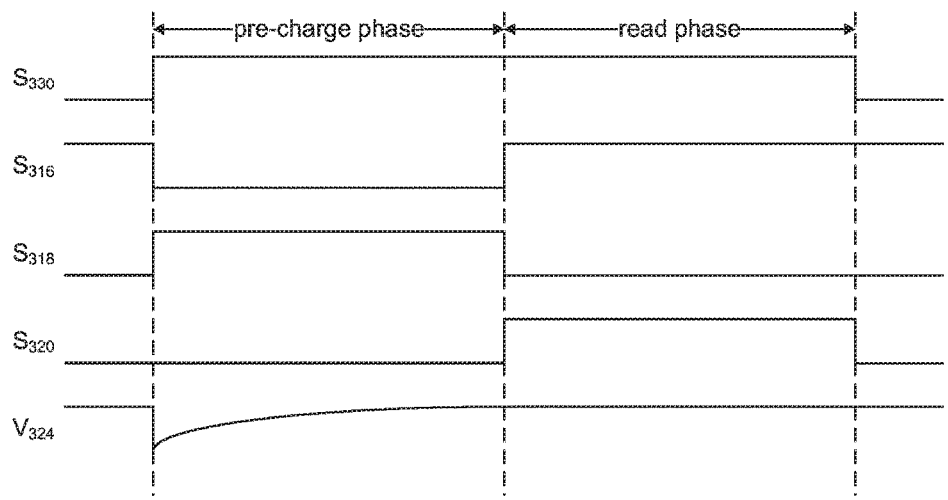
FIG. 4 shows a timing diagram illustrating signals associated with the sense structure of FIGS. 2 and 3 during a read operation, according to an embodiment of the present invention.

FIG. 3 shows details of sense structure 200, according to an embodiment of the present invention. FIG. 3 shows a single sense amplifier 202 for clarity purposes. FIG. 4 shows a timing diagram illustrating signals associated with sense structure 200 during a read operation, according to an embodiment of the present invention. FIG. 3 may be understood in view of FIG. 4.

As shown in FIG. 3, biasing stage 204 includes amplifier 308, transistor 310 and current source 312. Sense amplifier 202 includes sense amplifier core 328, sense control circuit 314, transistors 322 and 324, local capacitor 326, and switches 318, and 320.

When the NVM 100 is not executing a reading or writing operation, switch 316 is closed (i.e., conducting), switches 318, 320 and 330 are open (i.e., not conducting), and transistor 324 is on (i.e., conducting), as shown in FIG. 4. In this state, voltage $V_{bias}$ is applied to the gate terminal of transistor 322, and capacitor 326 has a voltage across its terminal equal to voltage $V_{bias}$.

At the beginning of the pre-charge phase, switch 316 is opened, switches 318 and 330 are closed, and transistor 324 is turned off, as shown in FIG. 4. At this time, capacitor 326, which is charged to voltage $V_{bias}$, is no longer connected to ground. As a result, current flows through switch 318 and transistor 322 and the voltage $V_{cascode}$ begins to overshoot above voltage $V_{bias}$, aided by the gate-source capacitance of transistor 322 (not shown). The overshoot of voltage $V_{cascode}$ causes transistor 322 to turn on faster than without the overshoot.

The overshoot of voltage $V_{cascode}$ is capable of reaching a voltage equal to $Vdd=V_{bias}$ if no overshoot limiting mechanism is used. During the pre-charge phase, sense control circuit 314 monitors the voltage across switch 316, and controls the gate of transistor 324 to limit the overshoot of voltage $V_{cascode}$. For example, in some embodiments, voltage $V_{324}$ increases as the different between $V_{cascode}$ and $V_{bias}$ increases. As a result, capacitor 326 transitions from not being connected to ground, to being resistively connected to ground, as shown in FIG. 4. At the end of the pre-charge phase, transistor 324 is turned fully on, capacitor 326 is connected between the gate of transistor 322 and ground, and switch 316 is closed, as shown in FIG. 4. In some embodiments, capacitor 324 may be connected to ground using a different transistor (not shown) instead of or in addition to turning fully on transistor 324.

At the beginning of the read-phase and after bit line $BL_j$ achieves read voltage VBL, switch 318 is opened, and switch 320 is closed, as shown in FIG. 4. At this time, sense amplifier core 328 is connected to memory cell 114. During the read phase, sense amplifier core 328 measures the measurement current Im (flowing through switch 320, transistors 322, and switch 330, and compares it with reference current Iref (not shown in FIG. 3). Sense amplifier 328 generates output Vout based on comparing measurement current Im with reference current Iref.

As shown in FIG. 3, signals $S_{316}$, $S_{318}$ and $S_{320}$, which controls switches 316, 318 and 320, are generated by controlled 112. Signal $S_{330}$, which controls switch 330, is generate by column decoder 104. Switches 316, 318, 320, and 330 may be implemented in any way known in the art. For example, switches 316, 318, 320, and 330 may be implemented with MOS transistors, such as NMOS and/or PMOS transistors.

Biasing stage 204 generates voltage $V_{bias}$ by using amplifier 308 and transistor 310. As shown, voltage $V_{bias}$ is applied to the gate of transistor 310 such that voltage $V_{bias1}$ is equal to VBL. Transistor 310 has similar characteristics as transistor 322 such that when $V_{bias}$ is applied to transistor 322, the voltage at the source of transistor 322 is equal to voltage VBL.

As shown in FIG. 3, biasing stage 204 receives supply voltage Vdd. In some embodiment, biasing stage 204 receives instead a boosted voltage $V_{boost}$ higher than supply voltage Vdd. Boosted voltage Vdd may be generated by a charge pump, for example. In some embodiments, biasing stage 204 may receive a supply voltage lower than Vdd.

Transistors 310, 322 and 324 are implemented as NMOS transistors. A person skilled in the art would recognize that other types of transistors, such as PMOS transistors, may also be used with appropriate modifications of the circuit.

Sense amplifier core 328 may be implemented in any way known in the art. For example, some embodiments may use a differential amplifier to compare measurement current Im with reference current Iref and generate output Vout. In some embodiments, sense amplifier core 328 includes one or more latches. Other implementations are also possible.

Sense control circuit 314 is configured to control transistor 324 using voltage V324 to reduce the pre-charge time by allowing voltage $V_{cascode}$ to overshoot while limiting the overshoot voltage. In some embodiments, such as shown in FIG. 3, sense control circuit 314 controls transistor 324 in a closed loop manner by monitoring the voltage across switch 316. In other embodiments, sense control circuit 314 generates voltage V324 in an open loop manner, without monitoring the voltage across switch 316. In open loop embodiments, the waveform of voltage $V_{324}$ may be determined, for example, during a characterization phase (e.g., during manufacturing or testing of the memory device).

It is understood that the waveform of voltage $V_{324}$ shown in FIG. 4 is a non-limiting example of a possible waveform. Voltage $V_{324}$ may exhibit different waveform shapes, such as a linear ramp, for example.

Figure 5:
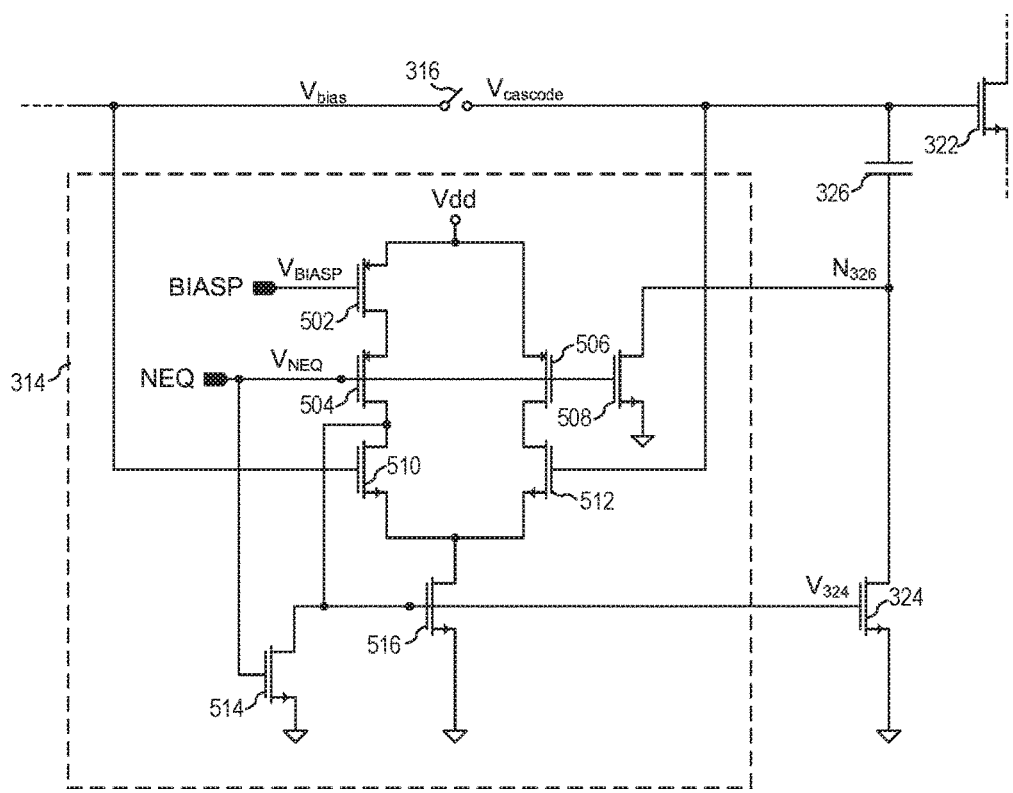
FIG. 5 shows details of the sense control circuit of FIG. 3, according to an embodiment of the present invention.
Figure 6:
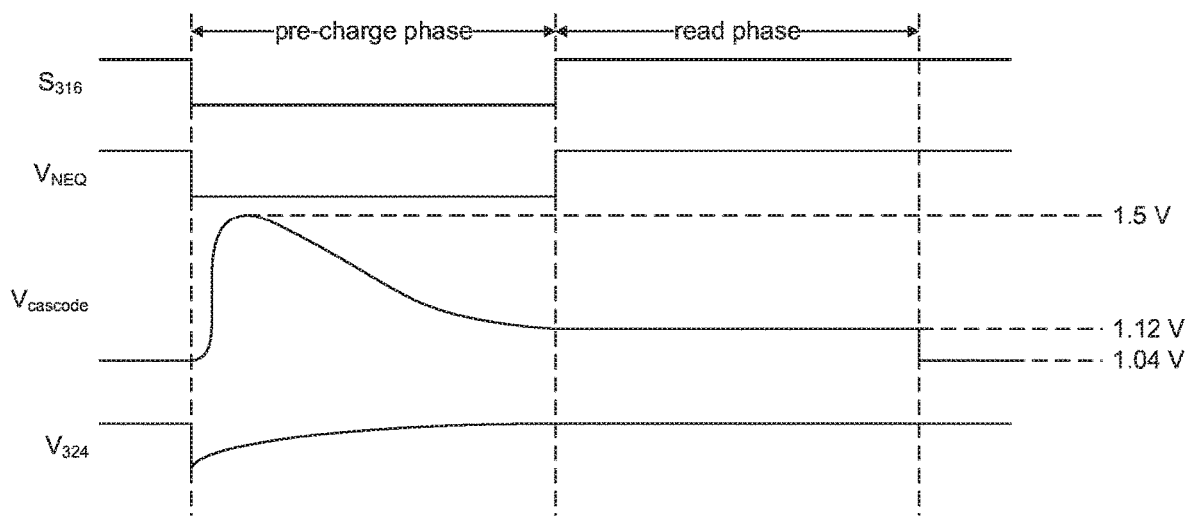
FIG. 6 shows a timing diagram illustrating signals associated with sense control circuit of FIG. 5 during a read operation, according to an embodiment of the present invention.

FIG. 5 shows details of sense control circuit 314, according to an embodiment of the present invention. FIG. 6 shows a timing diagram illustrating signals associated with sense control circuit 314 during a read operation, according to an embodiment of the present invention. FIG. 5 may be understood in view of FIG. 6.

As shown in FIG. 5, sense control circuit 314 includes transistors 502, 504, 506, 508, 510, 512, 514, and 516, and terminals. The drain of transistor 508 is coupled to capacitor 326. The gates of transistors 510 and 512 and respectively coupled across switch 316. The drain of transistor 514 is coupled to the gate of transistor 324. Terminal NEQ is coupled to the gates of transistors 504, 506, 508 and 514. Terminal BIASP is coupled to the gate of transistor 502.

During normal operation, voltage $V_{BIASP}$ is kept at a biasing voltage. In some embodiments, voltage $V_{BIASP}$ is also used to bias one or more transistors inside sense amplifier core 328.

Before the pre-charge phase begins, voltage $V_{NEQ}$ is high, as shown in FIG. 6. When voltage $V_{NEQ}$ is high, transistor 508 is on, connecting capacitor 326 to ground. When voltage $V_{NEQ}$ is high, transistors 514 is also on, keeping voltage V324 low, which keeps transistors 324 off. Capacitor 326, therefore, is charged to voltage $V_{cascode}$.

At the beginning of the pre-charge phase, switch 316 is opened, and voltage $V_{NEQ}$ transitions from high to low, as shown in FIG. 6. As a result, transistor 508 stops pulling capacitor 326 to ground, and transistors 514 stops pulling the gate of transistors 324 to ground. Node $N_{326}$, therefore, is left floating. As a result, voltage $V_{cascode}$ begins to overshoot, as shown in FIG. 6.

Voltage $V_{NEQ}$ being low also causes transistors 504 and 506 to turn on. As voltage $V_{cascode}$ increases above voltage $V_{bias}$, transistor 512 becomes more conductive while transistor 510 becomes less conductive. Therefore, the current flowing through transistor 516 flows mostly through transistors 506 and 512. As a result, voltage $V_{324}$, which is applied to the gates of transistors 324 and 516, increases.

As voltage $V_{324}$ increases, transistor 324 becomes more conductive and pulls to ground node $N_{326}$, thereby reducing the overshoot of voltage $V_{cascode}$, as shown in FIG. 6. At the end of the pre-charge phase, voltage $V_{NEQ}$ transitions from low to high, thereby connecting to ground capacitor 326 via transistor 508, and turning off transistors 504, 506 and 516, thereby preventing current flow through transistors 502, 504, 510, 512 and 516.

As shown in FIG. 6, in some embodiments, $V_{cascode}$ is higher than $V_{bias}$ during the read phase. During the read phase $V_{cascode}$ remains higher than $V_{bias}$ because of charge sharing between local capacitor 326 and the gate-source capacitance of cascode transistor 322.

Advantages of some embodiments include increasing the reading speed while keeping the power consumption low. Additional advantages include that by disconnected the gate of the cascode transistor from the biasing stage during the pre-charge phase, noise associated with pre-charging the bit lines is not propagated to voltage $V_{bias}$.

Figure 7:
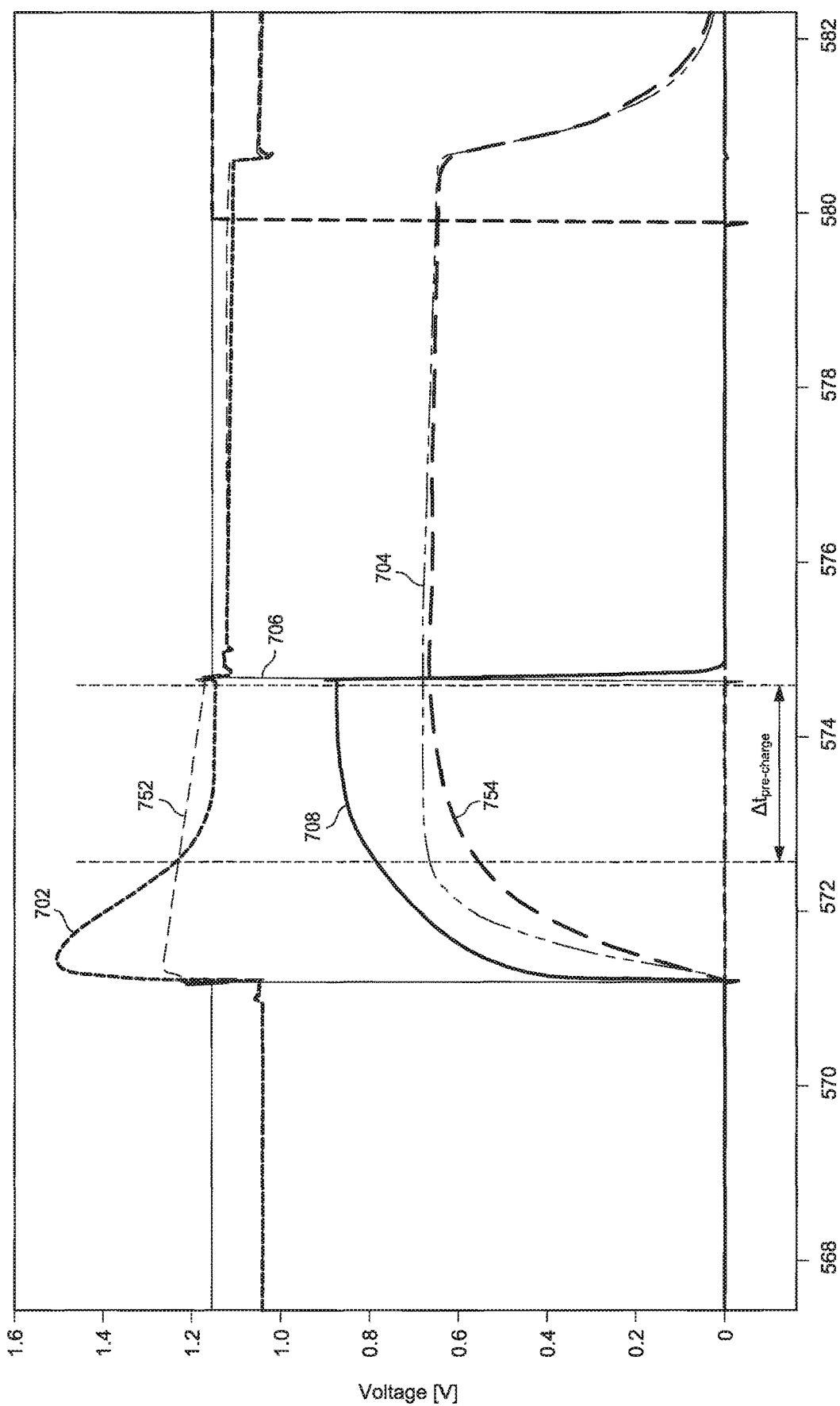
FIG. 7 shows waveforms of the NVM of FIG. 1, according to an embodiment of the present invention.

FIG. 7 shows waveforms of NVM 100, according to an embodiment of the present invention. FIG. 7 also shows waveforms of the open loop implementation described in U.S. Pat. No. 9,679,618, which does not use transistor 324 and control circuit 314 for comparison purposes. Curves 702 and 752 show voltage $V_{cascode}$ in NVM 100 and the open loop implementation, respectively. Curves 704 and 754 show the voltage bit line $BL_j$ of NVM 100 and the open loop implementation, respectively. Curve 706 shows voltage $V_{NEQ}$ of NVM 100. Curve 708 shows voltage $V_{324}$ of NVM 100.

As shown by curves 702 and 752, the overshoot of voltage $V_{cascode}$ of NVM 100 is about 270 mV higher (about 20% higher) than the overshoot of voltage $V_{cascode}$ of the open loop implementation disclosed in U.S. Pat. No. 9,679,618. The increase in overshoot results in this example in a reduction of the pre-charge time to 1.5 ns, which is about 2 ns faster than the 3.5 ns pre-charge time of the open-loop implementation disclosed in U.S. Pat. No. 9,679,618.

Figure 8:
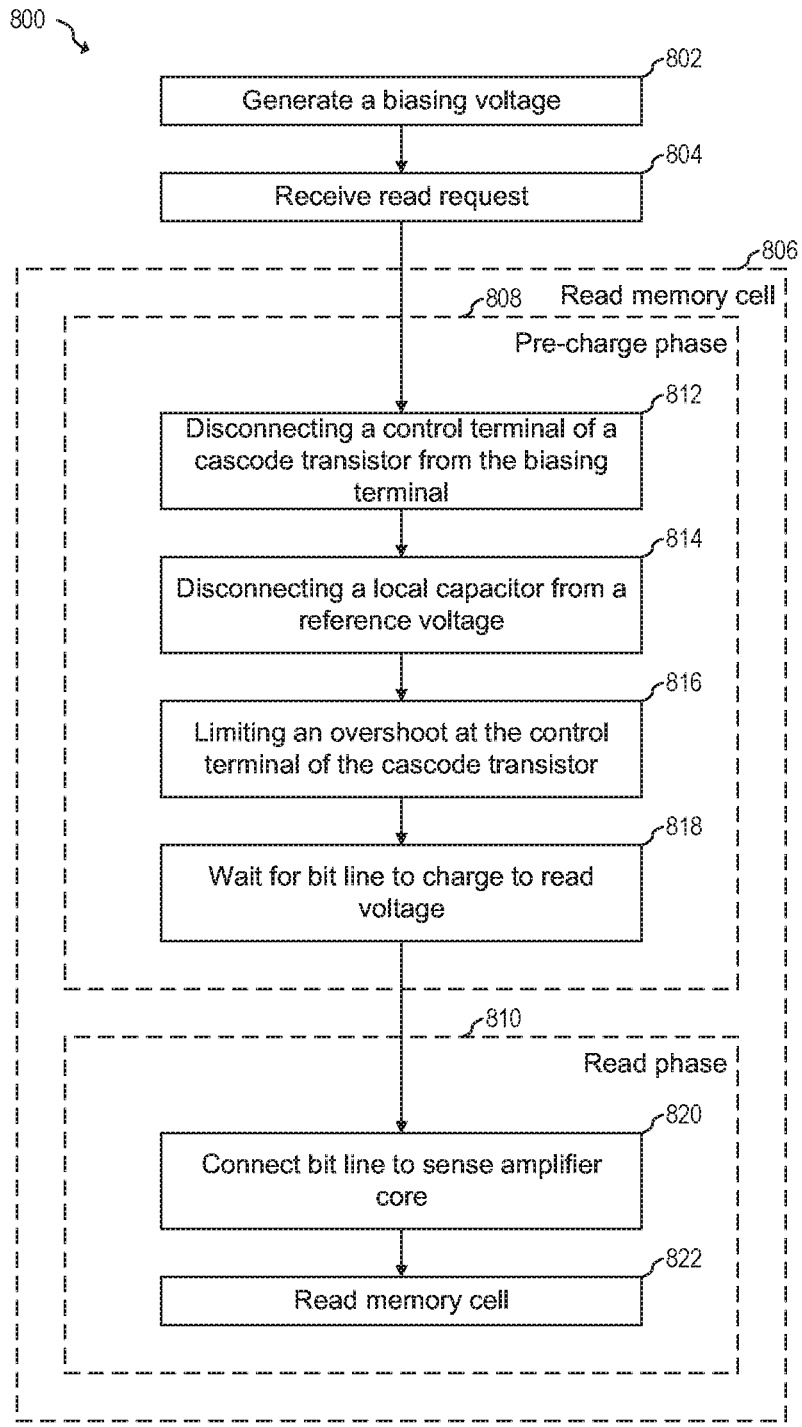
FIG. 8 shows an embodiment method of reading a memory cell, according to an embodiment of the present invention.

FIG. 8 shows embodiment method 800 of reading a memory cell, according to an embodiment of the present invention. Method 800 may be implemented, for example, by NVM 100. Method 800 may also be implemented by other memory devices. The description that follows assumes that an NVM, such as NVM 100, implements method 800 of reading a memory cell.

During step 802, an NVM, such as NVM 100, generates a biasing voltage. The biasing voltage may be generated by a biasing stage, such as biasing stage 204. Other biasing stage implementations may be used.

During step 804, the NVM receives an instruction to read one or more memory cells. The instruction may be received, for example, by controller 112.

During step 806, the one or more memory cells are read. Step 806 includes step 808 for pre-charging one or more selected bit lines associated with the one or more memory cells to be read. Step 806 also includes step 810 for reading the one or more memory cells. Although step 806 may be performed with respect to a single memory cell, it is understood that a plurality of memory cells may be read simultaneously as described in steps 808 and 810.

Step 808 includes steps 812, 814, 816, and 818. During step 812, a control terminal of a cascode transistor, such as cascode transistor 322, is disconnected from the output of the biasing stage. During step 814, a local capacitor, such as local capacitor 326 is disconnected from a reference terminal, such as a ground terminal. As a result, the control terminal of the cascode transistor is left floating.

During step 816, a control circuit, such as control circuit 314, limits a voltage overshoot in the control terminal of the cascode transistor. The voltage overshoot may be limited by adjusting a control terminal of a first transistor that is coupled between the local capacitor and the reference terminal. In some embodiments, the control circuit adjusted the control terminal of the first transistor based on the output of the biasing stage and the voltage at the control terminal of the cascode transistor.

During step 818, the bit lines associated with the memory cells to be read are charged to the read voltage. In some embodiments, the wait time is fixed. In other embodiments, the voltage of the bit line is monitored (measured) and the wait time is based on the measured voltage of the bit lines, such as when a dummy sense is used to close reading window. After the bit lines are charged the memory cells are read during step 810.

During step 820, the bit lines, which are already at the read voltage, are connected to respective sense amplifier cores, such as sense amplifier core 328. The sense amplifier core compares a measurement current, such as measurement current Im flowing through the respective bit line with a reference current, such as reference current Iref, and determines the value stored in the respective memory cell based on the comparison during step 822.

Example embodiments of the present invention are summarized here. Other embodiments can also be understood from the entirety of the specification and the claims filed herein.

Example 1

A sense structure including: a sense amplifier core configured to compare a measurement current with a reference current; a cascode transistor coupled to the sense amplifier core and configured to be coupled to a load; a switch coupled between a bias voltage node and a control terminal of the cascode transistor; a local capacitor having a first terminal coupled to the control terminal of the cascode transistor; a first transistor coupled between a second terminal of the local capacitor and a reference terminal; and a control circuit coupled to a control terminal of the first transistor, the control circuit configured to disconnect the local capacitor from the reference terminal to produce a voltage overshoot in the control terminal of the cascode transistor, and after disconnecting the local capacitor from the reference terminal, limit or reduce the voltage overshoot by adjusting a voltage of the control terminal of the first transistor.

Example 2

The sense structure of example 1, where the control circuit is configured to adjust the voltage of the control terminal of the first transistor based on a voltage across the switch.

Example 3

The sense structure of one of examples 1 or 2, where the control circuit includes: a second transistor coupled between the second terminal of the local capacitor and the reference terminal; a third transistor coupled between the control terminal of the first transistor and the reference terminal; and a first terminal configured to receive a first voltage, where the first terminal is coupled to a control terminal of the second transistor and to a control terminal of the third transistor.

Example 4

The sense structure of one of examples 1 to 3, where the control circuit further includes: a fourth transistor having a control terminal coupled to the control terminal of the first transistor; a fifth transistor coupled between a supply terminal of the control circuit and the fourth transistor, the fifth transistor having a control terminal coupled to the bias voltage node; and a sixth transistor coupled between the supply terminal of the control circuit and the fourth transistor, the sixth transistor having a control terminal coupled to the control terminal of the cascode transistor.

Example 5

The sense structure of one of examples 1 to 4, where the control circuit further includes: a seventh transistor coupled between the supply terminal of the control circuit and the fifth transistor, the seventh transistor having a control terminal coupled to the first terminal; and an eighths transistor coupled between the supply terminal of the control circuit and the sixth transistor, the eighths transistor having a control terminal coupled to the first terminal.

Example 6

The sense structure of one of examples 1 to 5, where the first, second, third, fourth, fifth, and sixth transistors are NMOS transistors and where the seventh and eighths transistors are PMOS transistors.

Example 7

The sense structure of one of examples 1 to 6, where the control circuit further includes a ninth transistor coupled between the supply terminal of the control circuit and the fifth transistor, the ninth transistor having a control terminal configured to receive a second biasing voltage, and where the sense amplifier core is configured to receive the second biasing voltage.

Example 8

The sense structure of one of examples 1 to 7, where the control terminal of the fourth transistor is coupled to a drain terminal of the fifth transistor.

Example 9

The sense structure of one of examples 1 to 8, further including: a second switch coupled between a supply terminal of the sense structure and the cascode transistor; and a third switch coupled between the second switch and the sense amplifier core.

Example 10

The sense structure of one of examples 1 to 9, further including a biasing stage configured to generate a biasing voltage at the bias voltage node, where the biasing stage includes: an amplifier having an output coupled to the output of the biasing stage; a common capacitor coupled to the output of the biasing stage; and a tenth transistor having a control terminal coupled to the output of the biasing stage.

Example 11

The sense structure of one of examples 1 to 10, where the cascode transistor is configured to be coupled to a memory cell as the load.

Example 12

A non-volatile memory including: a plurality of memory cells arranged in rows a columns; a row decoder coupled to the plurality of memory cells via a plurality of word lines; a column decoder coupled to the plurality of memory cells via a plurality of bit lines; a biasing stage configured to generate a biasing voltage; and a plurality of sense amplifiers, where each sense amplifier includes: a sense amplifier core configured to compare a measurement current with a reference current; a cascode transistor coupled between the sense amplifier core and a bit line of the plurality of bit lines; a switch coupled between an output of the biasing stage and a control terminal of the cascode transistor; a local capacitor having a first terminal coupled to the control terminal of the cascode transistor; a first transistor coupled between a second terminal of the local capacitor and a reference terminal; and a control circuit coupled to a control terminal of the first transistor, the control circuit configured to disconnect the local capacitor from the reference terminal to produce a voltage overshoot in the control terminal of the cascode transistor; and after disconnecting the local capacitor from the reference terminal, limit or reduce the voltage overshoot by adjusting a voltage of the control terminal of the first transistor.

Example 13

The non-volatile memory of example 12, further including a controller configured to: receive a read request; open the switch in response to the read request; and cause the control circuit to disconnect the local capacitor from the reference terminal in response to the read request.

Example 14

The non-volatile memory of one of examples 12 or 13, where the controller causes the control circuit to disconnect the local capacitor from the reference terminal at the same time opening the switch.

Example 15

The non-volatile memory of one of examples 12 to 14, where each sense amplifier further includes: a second switch coupled between a supply terminal of the sense amplifier and the cascode transistor; and a third switch coupled between the second switch and the sense amplifier core, and where the controller is further configured to close the second switch when the switch is opened.

Example 16

The non-volatile memory of one of examples 12 to 15, where the biasing stage includes: an amplifier having an output coupled to the output of the biasing stage; a common capacitor coupled to the output of the biasing stage; and a tenth transistor having a control terminal coupled to the output of the biasing stage.

Example 17

The non-volatile memory of one of examples 12 to 16, where each memory cell of the plurality of memory cells includes a floating-gate transistor.

Example 18

A method of reading a non-volatile memory, the method including: generating a biasing voltage at a biasing terminal; during a pre-charge phase, disconnecting a control terminal of a cascode transistor from the biasing terminal, the cascode transistor coupled between a sense amplifier core and a bit line of the non-volatile memory; disconnecting from a reference terminal a local capacitor that is coupled to the control terminal of the cascode transistor; and after disconnecting the local capacitor from the reference terminal, limiting or reducing a voltage overshoot at the control terminal of the cascode transistor by adjusting a voltage of a control terminal of a first transistor coupled between the local capacitor and the reference terminal.

Example 19

The method of example 18, where disconnecting the control terminal of the cascode transistor from the biasing terminal includes opening a first switch coupled between the biasing terminal and a control terminal of a cascode transistor, the method further including: receiving a read request; and in response to the read request, opening the first switch; closing a second switch coupled between a supply terminal and the cascode transistor; and closing a third switch coupled between the cascode transistor and the bit line.

Example 20

The method of one of examples 18 or 19, where adjusting the voltage of the control terminal of the first transistor includes adjusting the voltage of the control terminal of the first transistor based on a voltage across the first switch.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A sense structure comprising:
   a sense amplifier core configured to compare a measurement current with a reference current;
   a cascode transistor coupled to the sense amplifier core and configured to be coupled to a load;
   a switch coupled between a bias voltage node and a control terminal of the cascode transistor;
   a local capacitor having a first terminal coupled to the control terminal of the cascode transistor;
   a first transistor coupled between a second terminal of the local capacitor and a reference terminal; and
   a control circuit coupled to a control terminal of the first transistor, the control circuit configured to disconnect the local capacitor from the reference terminal to produce a voltage overshoot in the control terminal of the cascode transistor, and after disconnecting the local capacitor from the reference terminal, limit or reduce the voltage overshoot by adjusting a voltage of the control terminal of the first transistor.

2. The sense structure of claim 1, wherein the control circuit is configured to adjust the voltage of the control terminal of the first transistor based on a voltage across the switch.

3. The sense structure of claim 1, wherein the control circuit comprises:
   a second transistor coupled between the second terminal of the local capacitor and the reference terminal;
   a third transistor coupled between the control terminal of the first transistor and the reference terminal; and
   a first terminal configured to receive a first voltage, wherein the first terminal is coupled to a control terminal of the second transistor and to a control terminal of the third transistor.

4. The sense structure of claim 3, wherein the control circuit further comprises:
   a fourth transistor having a control terminal coupled to the control terminal of the first transistor;
   a fifth transistor coupled between a supply terminal of the control circuit and the fourth transistor, the fifth transistor having a control terminal coupled to the bias voltage node; and
   a sixth transistor coupled between the supply terminal of the control circuit and the fourth transistor, the sixth transistor having a control terminal coupled to the control terminal of the cascode transistor.

5. The sense structure of claim 4, wherein the control circuit further comprises:
   a seventh transistor coupled between the supply terminal of the control circuit and the fifth transistor, the seventh transistor having a control terminal coupled to the first terminal; and
   an eighths transistor coupled between the supply terminal of the control circuit and the sixth transistor, the eighths transistor having a control terminal coupled to the first terminal.

6. The sense structure of claim 5, wherein the first, second, third, fourth, fifth, and sixth transistors are NMOS transistors and wherein the seventh and eighths transistors are PMOS transistors.

7. The sense structure of claim 5, wherein the control circuit further comprises a ninth transistor coupled between the supply terminal of the control circuit and the fifth transistor, the ninth transistor having a control terminal configured to receive a second biasing voltage, and wherein the sense amplifier core is configured to receive the second biasing voltage.

8. The sense structure of claim 5, wherein the control terminal of the fourth transistor is coupled to a drain terminal of the fifth transistor.

9. The sense structure of claim 1, further comprising:
   a second switch coupled between a supply terminal of the sense structure and the cascode transistor; and
   a third switch coupled between the second switch and the sense amplifier core.

10. The sense structure of claim 1, further comprising a biasing stage configured to generate a biasing voltage at the bias voltage node, wherein the biasing stage comprises:
    an amplifier having an output coupled to the output of the biasing stage;
    a common capacitor coupled to the output of the biasing stage; and
    a tenth transistor having a control terminal coupled to the output of the biasing stage.

11. The sense structure of claim 1, wherein the cascode transistor is configured to be coupled to a memory cell as the load.

12. A non-volatile memory comprising:
    a plurality of memory cells arranged in rows a columns;
    a row decoder coupled to the plurality of memory cells via a plurality of word lines;
    a column decoder coupled to the plurality of memory cells via a plurality of bit lines;
    a biasing stage configured to generate a biasing voltage; and
    a plurality of sense amplifiers, wherein each sense amplifier comprises:
        a sense amplifier core configured to compare a measurement current with a reference current;
        a cascode transistor coupled between the sense amplifier core and a bit line of the plurality of bit lines;
        a switch coupled between an output of the biasing stage and a control terminal of the cascode transistor;
        a local capacitor having a first terminal coupled to the control terminal of the cascode transistor;
        a first transistor coupled between a second terminal of the local capacitor and a reference terminal; and
        a control circuit coupled to a control terminal of the first transistor, the control circuit configured to disconnect the local capacitor from the reference terminal to produce a voltage overshoot in the control terminal of the cascode transistor; and after disconnecting the local capacitor from the reference terminal, limit or reduce the voltage overshoot by adjusting a voltage of the control terminal of the first transistor.

13. The non-volatile memory of claim 12, further comprising a controller configured to:
    receive a read request;
    open the switch in response to the read request; and
    cause the control circuit to disconnect the local capacitor from the reference terminal in response to the read request.

14. The non-volatile memory of claim 13, wherein the controller causes the control circuit to disconnect the local capacitor from the reference terminal at the same time opening the switch.

15. The non-volatile memory of claim 13, wherein each sense amplifier further comprises:
   a second switch coupled between a supply terminal of the sense amplifier and the cascode transistor; and
   a third switch coupled between the second switch and the sense amplifier core, and wherein the controller is further configured to close the second switch when the switch is opened.

16. The non-volatile memory of claim 12, wherein the biasing stage comprises:
   an amplifier having an output coupled to the output of the biasing stage;
   a common capacitor coupled to the output of the biasing stage; and
   a tenth transistor having a control terminal coupled to the output of the biasing stage.

17. The non-volatile memory of claim 12, wherein each memory cell of the plurality of memory cells comprises a floating-gate transistor.

18. A method of reading a non-volatile memory, the method comprising:
   generating a biasing voltage at a biasing terminal;
   during a pre-charge phase,
      disconnecting a control terminal of a cascode transistor from the biasing terminal, the cascode transistor coupled between a sense amplifier core and a bit line of the non-volatile memory;
      disconnecting from a reference terminal a local capacitor that is coupled to the control terminal of the cascode transistor; and
      after disconnecting the local capacitor from the reference terminal, limiting or reducing a voltage overshoot at the control terminal of the cascode transistor by adjusting a voltage of a control terminal of a first transistor coupled between the local capacitor and the reference terminal.

19. The method of claim 18, wherein disconnecting the control terminal of the cascode transistor from the biasing terminal comprises opening a first switch coupled between the biasing terminal and the control terminal of the cascode transistor, the method further comprising:
   receiving a read request; and
   in response to the read request,
      opening the first switch;
      closing a second switch coupled between a supply terminal and the cascode transistor; and
      closing a third switch coupled between the cascode transistor and the bit line.

20. The method of claim 19, wherein adjusting the voltage of the control terminal of the first transistor comprises adjusting the voltage of the control terminal of the first transistor based on a voltage across the first switch.

\* \* \* \* \*